(12) United States Patent
Liberol et al.

(10) Patent No.: US 7,162,679 B2
(45) Date of Patent: Jan. 9, 2007

(54) METHODS AND APPARATUS FOR CODING AND DECODING DATA USING REED-SOLOMON CODES

(75) Inventors: Boris Liberol, Norwood, MA (US); Yoon Yung Lee, Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 540 days.

(21) Appl. No.: 10/735,423

(22) Filed: Dec. 12, 2003

(65) Prior Publication Data

US 2005/0149832 A1    Jul. 7, 2005

(51) Int. Cl.
*H03M 13/00* (2006.01)
(52) U.S. Cl. ...................... 714/759; 714/784
(58) Field of Classification Search ................ 714/759, 714/784
See application file for complete search history.

(56) References Cited

U.S. PATENT DOCUMENTS

| | | | |
|---|---|---|---|
| 4,142,174 A | | 2/1979 | Chen et al. |
| 4,567,594 A | | 1/1986 | Deodhar |
| 4,763,332 A | | 8/1988 | Glover |
| 4,847,801 A | | 7/1989 | Tong |
| 5,428,629 A | * | 6/1995 | Gutman et al. ............. 714/758 |
| 5,715,258 A | * | 2/1998 | Ikeda et al. .................. 714/759 |
| 5,942,005 A | | 8/1999 | Hassner et al. |
| 5,948,117 A | | 9/1999 | Weng et al. |
| 6,131,178 A | | 10/2000 | Fujita et al. |
| 6,173,429 B1 | | 1/2001 | Twitchell et al. |
| 6,263,470 B1 | | 7/2001 | Hung et al. |
| 6,360,348 B1 | * | 3/2002 | Yang ........................... 714/784 |
| 6,757,862 B1 | * | 6/2004 | Marianetti, II .............. 714/774 |

FOREIGN PATENT DOCUMENTS

| | | |
|---|---|---|
| EP | 1 037 148 A1 | 9/2000 |
| GB | 2 155 669 A | 9/1985 |

OTHER PUBLICATIONS

International Search Report and Written Opinion of the International Searching Authority from corresponding International Application No. PCT/US2004/038272.

N. Clarke and A. Cantoni, "Implementation of dynamic look-up tables", IEEE Proc.-Comput. Digit. Tech., vol. 141, No. 6, Nov. 1994, pp. 391-397.

\* cited by examiner

*Primary Examiner*—Albert Decady
*Assistant Examiner*—Mujtaba K. Chaudry
(74) *Attorney, Agent, or Firm*—Wolf, Greenfield & Sacks, P.C.

(57) ABSTRACT

Methods and apparatus are provided for encoding data. The method includes (a) providing a first table of first component values multiplied by code generator coefficients and a second table of second component values multiplied by the code generator coefficients, (b) determining a Galois field element based on a message symbol and a high order remainder symbol, (c) separating the Galois field element into first and second components, (d) using the first component and a generator coefficient index to access one or more first table values in the first table and using the second component and the generator coefficient index to access one or more second table values in the second table, (e) determining a current remainder symbol based on first and second table values having equal generator coefficient indices, and a previous remainder symbol, (f) performing step (e) for each generator coefficient of the code generator to provide a set of remainder symbols, and (g) performing steps (b)–(f) for each message symbol in a codeword to provide a set of final remainder symbols which constitute check symbols to be transmitted with the message symbols of the codeword.

24 Claims, 6 Drawing Sheets

FIG. 4A

| TabH | $g_0H$ | $g_1H$ | ... | $g_{2t-1}H$ |
|---|---|---|---|---|
| 00 | 0 | 0 | 0 | 0 |
| 10 | $g_0*10$ | $g_1*10$ | ... | $g_{2t-1}*10$ |
| ... | ... | ... | ... | ... |
| F0 | $g_0*F0$ | $g_1*F0$ | ... | $g_{2t-1}*F0$ |

| TabL | $g_0L$ | $g_1L$ | ... | $g_{2t-1}L$ |
|---|---|---|---|---|
| 0 | 0 | 0 | 0 | 0 |
| 1 | $g_0$ | $g_1$ | ... | $g_{2t-1}$ |
| ... | ... | ... | ... | ... |
| F | $g_0F$ | $g_1F$ | ... | $g_{2t-1}F$ |

72

METHODS AND APPARATUS FOR CODING AND DECODING DATA USING REED-SOLOMON CODES

FIELD OF THE INVENTION

The present invention relates to coding data and, more particularly, to methods and apparatus for Reed-Solomon coding.

BACKGROUND OF THE INVENTION

The procedure for transmitting and receiving information using Reed-Solomon codes for error detection and correction can be described as follows. Information to be transmitted, universally represented as a stream of bits, is divided into small blocks of a certain size m. These small blocks of m bits can be identified with the elements of a mathematical structure known as finite field (or Galois Field) in the sense that there is one-to-one mapping between the set of all possible $2^m$ blocks of m bits and the set of all $2^m$ elements of the Galois Field (GF) of dimension $2^m$, $GF(2^m)$. The Galois field itself can be constructed as the set of all polynomials of degree<m with the coefficients from the "ground" binary field GF(2) whose elements are 0 and 1 and two field operations, addition and multiplication, defined as follows: addition is performed as an "exclusive OR" (XOR) operation on the ordered m-tuple of polynomial coefficients and multiplication is implemented as polynomial multiplication modulo certain "primitive" binary polynomial of degree m as field multiplication, where the "primitive" binary polynomial is irreducible (can not be factored further into a product of binary polynomials of lower degree) and in addition, does not divide any binary polynomial of the form $x^d-1$ for $d<2^m-1$.

One of the most important and common cases is m=8, where each such a block is represented as byte and can be conveniently handled by any kind of computer, so the following discussion is for the case where bytes are the elements of GF(256), with the understanding that "byte" can be an element, or "symbol", of the Galois field of dimension $2^m$ with m≠8. The primitive polynomial that allows building of GF(256) is $p(x)=x^8+x^4+x^3+x^2+1$.

After setting up the basic units of information (bytes or symbols) and the corresponding Galois Field (GF), information to be transmitted is divided into groups of symbols of equal size k, which is found based upon the desired error correction capability of the code. Each such a group is called "message". A message is further interpreted as a polynomial M(x) over GF of degree k−1

$$M(x)=m_0 x^{k-1}+m_1 x^{k-2}+\ldots+m_{k-1} \quad (1)$$

whose coefficients $m_i$ in the ascending order are information symbols in the order they were obtained from the original stream of bits treated as GF elements. To construct a Reed-Solomon code capable of correcting t errors, a polynomial G(x) of degree 2t, known as a generator polynomial, is defined according to the following formula $$G(x)=(x-a^{2t-1})(x-a^{2t-2})\ldots(x-a^1)(x-a^0)=x^{2t}+g_{2t-1}+\ldots+g_0 \quad (2)$$

where a denotes the so-called "primitive" element of the GF possessing two important (and related) properties: first, it satisfies the equation p(a)=0, and second, as a consequence, all non-zero elements of the GF can be expressed as powers of the primitive element and form an abelian (or commutative) group under the operation of GF multiplication. It is exactly this property that permits creation of an "anti-log" table that establishes a convenient way to perform multiplication of the GF elements using this table.

Then the remainder R(x) of the division of message polynomial M(x) multiplied by $x^{2t}$ by the generator polynomial G(x) is found:

$$M(x)x^{2t}=Q(x)*G(x)+R(x), \quad (3)$$

The remainder is a polynomial of degree 2t−1 and finally, 2t coefficients of this polynomial are used as check symbols which are appended to k message symbols forming a string of k+2t symbols that comprise a "codeword" in systematic form. The length of the codeword should not exceed n−1, the number of non-zero elements in the GF. So the message actually transmitted over a communication channel can be represented as the polynomial $$M(x)*x^{2t}+R(x)=M(x)*x^{2t}+r_{2t-1}x^{2t-1}+\ldots+r_0 \quad (4)$$

where $r_m$ are check symbols—redundant symbols that allow detection and correction of up to t errors.

The task of encoding consists, therefore, in performing the division of polynomials whose coefficients are symbols of some GF. A conventional software approach to deal with calculations in the GF is based on using two look-up tables where transformations from the polynomial form of the GF symbols to exponential form and back are stored. This method can be summarized (for our main case of $GF(2^8)$) as follows:

1. Symbols (elements of the GF) in the polynomial form are represented as bytes:

$$b=(b_7 b_6 b_5 b_4 b_3 b_2 b_1 b_0). \quad (5)$$

2. The sum of the symbols is found as a bitwise XOR operation: $f+g=f\hat{\ }g$.
3. The primitive element a in polynomial form is represented as a=(00000010), which in polynomial notation corresponds to a(x)=x.
4. Each non-zero symbol s is primitive element a raised to a certain power $s=a^k$. Using polynomial algebra manipulations with binary polynomials, a discrete logarithm table log_table and an exponent table exp_table are pre-calculated to facilitate transformations between exponential (power) and polynomial (byte) representation of (non-zero) elements so that if $a^k$=b, then k=log_table[b], b=exp_table[k]. (6)

To multiply GF symbols using these tables, the following chain of operations should be performed assuming operands u and v and result r are in byte form:

$$GFMUL(u,v)=GFMUL(a^{log\_table[u]}, a^{log\_table[v]})=a^{(log\_table[u]+log\_table[v])\%255} \quad (7)$$

$$r=GFMUL(u,v)=\exp\_table[(log\_table[u]+log\_table[v])\%255] \quad (8)$$

where % denotes modulo operation (x %255 is the remainder of the division of x by 255).

It is clear that the speed of calculation of the result of multiplication over GF based on this approach is limited by the fact that multiple access to the tables is needed and the address of the entry into the exponent table should be calculated by addition. In many cases, access through the modified address register requires 2–3 waiting cycles so the total time of one GF multiplication can be 10–12 clock cycles per symbol (byte). This makes software implementation of the Reed-Solomon codes a challenging problem—e.g., in a typical case of (204,188,16) Reed-Solomon code with 188 data bytes and 16 check bytes to encode one codeword 188*16*(10–12)~=30–36 K cycles are needed, as described below. Thus, for example, for the ADSL application with a rate of transmission of 4 K Symbols/sec, the total consumption of MIPS for only the encoder operation is 120–144 MIPS, which is prohibitively high.

SUMMARY OF THE INVENTION

According to a first aspect of the invention, a method is provided for encoding data. The method comprises (a) providing a first table of first component values multiplied by code generator coefficients and a second table of second component values multiplied by the code generator coefficients, (b) determining a Galois field element based on a message symbol and a high order remainder symbol, (c) separating the Galois field element into first and second components, (d) using the first component and a generator coefficient index to access one or more first table values in the first tableland using the second component and the generator coefficient index to access one or more second table values in the second table, (e) determining a current remainder symbol based on first and second table values having equal generator coefficient indices, and a previous remainder symbol, (f) performing step (e) for each generator coefficient of the code generator to provide a set of remainder symbols, and (g) performing steps (b)–(f) for each message symbol in a codeword to provide a set of final remainder symbols which constitute check symbols to be transmitted with the message symbols of the codeword.

According to a second aspect of the invention, apparatus is provided for encoding data. The apparatus comprises a first lookup table containing first component values multiplied by code generator coefficients, a second lookup table containing second component values multiplied by the code generator coefficients, and a processor. The processor comprises means for determining a Galois field element based on a message symbol and a high order remainder symbol, means for separating the Galois field element into first and second components, means for using the first component and a generator coefficient index to access one or more first table values in the first lookup table and for using the second component and the generator coefficient index to access one or more second table values in the second lookup table, and means for determining a current remainder symbol, based on first and second table values having equal generator coefficient indices, and a previous remainder symbol, for each generator coefficient of the code generator to provide a set of remainder symbols. Each message symbol of a codeword is processed to provide a set of final remainder symbols which constitute check symbols to be transmitted with the message symbols of the codeword.

BRIEF DESCRIPTION OF THE DRAWINGS

For a better understanding of the present invention, reference is made to the accompanying drawings, which are incorporated herein by reference and in which:

FIGS. 4A and 4B illustrate embodiments of lookup tables for Reed-Solomon encoding in accordance with the invention;

DETAILED DESCRIPTION

Figure 1:
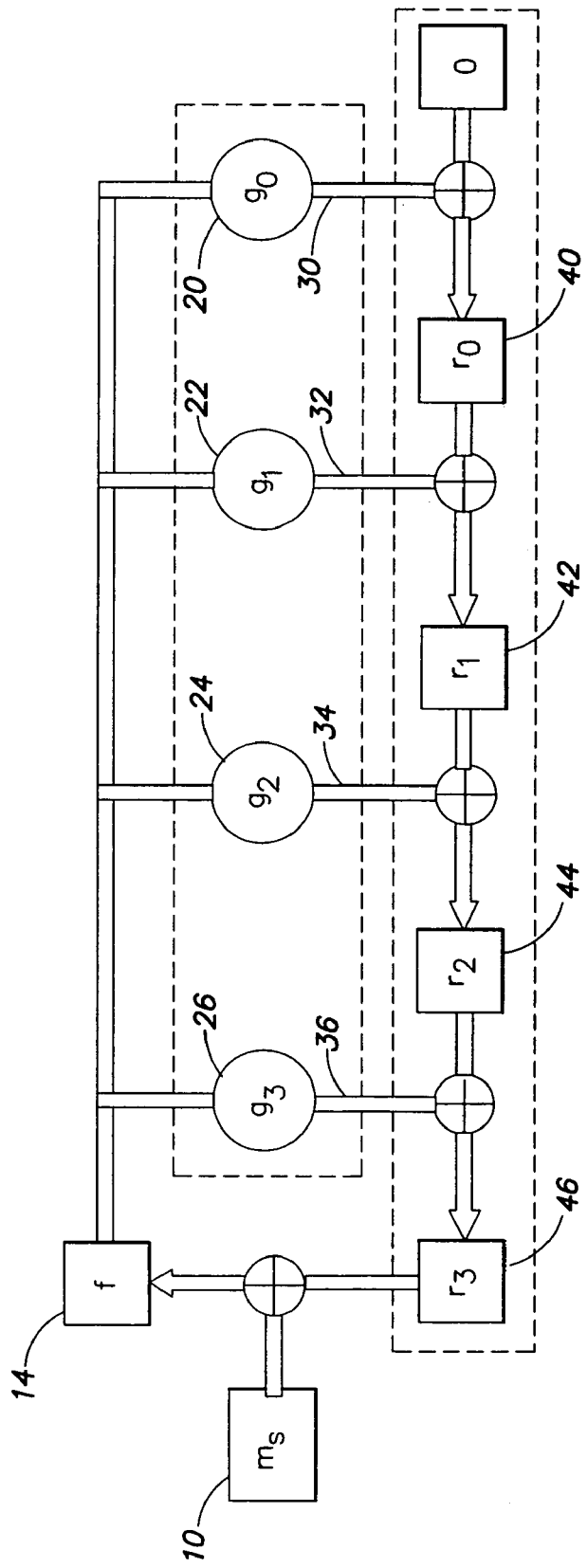
FIG. 1 is a schematic block diagram of a prior art method for Reed-Solomon encoding.

To describe a more efficient method of performing the specific task of encoding a message according to the Reed-Solomon (RS) coding procedure of the invention, a detailed description of the calculations involved is needed. The problem is formulated as finding the remainder of the division of the message polynomial $M(x)$ multiplied by $x^{2t}$ by the code generator polynomial $G(x)$.

The remainder can be calculated by iterating the message—increasing it's length, shifting already received bytes of the message to the left and moving in from the right a new byte, so that at the first step message $M_0(x)$ includes only one byte $m_0$, $$M_0(x)=m_0x^0=m_0, \quad (9)$$

and message $M_1(x)$ is considered to include two bytes, $m_1$ and $m_0$ with it's first byte $m_0$ shifted to the left by one position, which in polynomial notation can be written as $$M_1(x)=m_0x+m_1=M_0(x)*x+m_1 \quad (10)$$

It is convenient to introduce the "tail" $g(x)$ of the generator polynomial $G(x)$ $$G(x)=x^{2t}+g_{2t-1}x^{2t-1}+\ldots+g_0=x^{2t}+g(x) \quad (11)$$

with the property $$G(x)+g(x)=x^{2t}. \quad (12)$$

Using this property, at the first step, when only the first symbol of the message is encoded (the remainder $r_0$ is found), the following relations hold:

$$M_0(x)x^{2t}=m_0x^{2t}=Q_0(x)G(x)+R_0(x),$$
$$R_0(x)=r_{0,2t-1}x^{2t-1}+\ldots+r_{0,0} \quad (13)$$

$$m_0x^{2t}=m_0G+m_0g \quad (14)$$

Therefore, iterations start with $$Q_0(x)=m_0, \; R_0=m_0g. \quad (15)$$

After second step, the remainder can be calculated as follows:

$$\begin{aligned}M_1(x)x^{2t} &= (M_0(x)*x+m_1)x^{2t} \\ &= (x*M_0(x)*x^{2t}+m_1x^{2t}) \\ &= x*Q_0*G+(x*R_0(x)+m_1x^{2t}) \\ &= (Q_0*x)*G+(r_{0,2t-1}x^{2t}+m_1x^{2t})+ \\ &\quad (r_{0,2t-2}*x^{2t-1}+\ldots+r_{0,0}*x)\end{aligned} \quad (16)$$

-continued $$= (Q_0 * x + r_{0,2t-1} + m_1) * G +$$

$$(m_1 + r_{0,2t-1}) * g(x) +$$

$$(r_{0,2t-2} * x^{2t-1} + \ldots + r_{0,0} * x + 0 * x^0 +),$$

therefore, $$R_1(x) = (m_1 + r_{0,2t-1}) * g(x) + (r_{0,2t-2} * x^{2t-1} + \ldots + r_{0,0} * x + 0 * x^0). \quad (17)$$

Using this approach, in general, the remainder $r_{k+1}(x)$ after step k+1 can be calculated from the remainder $r_k(x)$ at the previous step k and new incoming byte $m_{k+1}$ exactly in the same way $$R_{k+1}(x) = (m_{k+1} + r_{k,2t-1}) * g(x) + (r_{k,2t-2} * x^{2t-1} + \ldots + r_{k,0} * x + 0 * x^0) = ((m_{k+1} + r_{k,2t-1}) * g_{2t-1} + r_{k,2t-2}) * x^{2t-1} + \ldots + ((m_{k+1} + r_{k,2t-1}) * g_0 \quad (18)$$

This computation can be implemented using the general notion of "shift register" r consisting of 2t symbols $$r = r_{2t-1}, r_{2t-2}, \ldots r_0. \quad (19)$$

At each iteration, 2t symbols are shifted to the left with a zero symbol shifting in from the right and the left-most symbol $r_{2t-1}$ shifting out of the register—this left-most symbol is added (XOR'ed) with the incoming symbol and forms "feedback" symbol $$f_{k+1} = m_{k+1} + r_{k,2t-1}. \quad (20)$$

Using these definitions, the remainder $R_k(x)$ is iterated according to the formula $$R_{k+1}(x) = (f_{k+1}g_{2t-1} + r_{k,2t-2})x^{2t-1} + (f_{k+1}g_{2t-2} + r_{k,2t-3})x^{2t-2} + \ldots + f_{k+1}g_0 \quad (21)$$

A schematic diagram representing the iteration of the remainder is shown in FIG. 1. In FIG. 1, a message symbol 10 ($m_s$) is summed with a high order remainder 46 ($r_3$) to provide a Galois field element 14 (f). As noted above, Galois field addition is performed as an exclusive OR operation. The Galois field element 14 is multiplied by code generator coefficients 20, 22, 24, and 26 ($g_0$, $g_1$, $g_2$ and $g_3$) to provide intermediate values 30, 32, 34 and 36. The intermediate values are summed with previous remainder symbols to provide current remainder symbols. Thus, the product $fg_0$ is summed with zero to provide remainder symbol 40 ($r_0$); the product $fg_1$ is summed with previous remainder symbol 40 to provide current remainder symbol 42 ($r_1$); the product $fg_2$ is summed with previous remainder symbol 42 to provide current remainder symbol 44 ($r_2$); and the product $fg_3$ is summed with previous remainder symbol 44 to provide current remainder symbol 46 ($r_3$). The process is repeated for each message symbol 10 in a codeword. After all message symbols in the codeword have been processed, the remainder symbols 40, 42, 44 and 46 represent check symbols for transmission with the message symbols. The codeword thus includes message symbols and check symbols. The example of FIG. 1 produces four check symbols for transmission with the message symbols and is capable of correcting two errors in the codeword. In a more common example, the code generator includes 16 code generator coefficients $g_i$ and produces 16 check symbols for correction of eight errors in the codeword.

It can be seen that when the conventional look-up table approach to the calculation of the remainder polynomial is used, the main bottleneck in the flow of computation is the repeated computation of the result of multiplication in the GF. For every byte of the message, 2t multiplications are needed, so to encode one codeword with n information bytes and 2t check bytes, 2nt GF multiplications have to be performed.

In the important case of the Reed-Solomon code correcting 8 errors with the symbols from GF(256) t=8, n=239 or less, a total of 3824 GF operations are performed. With 10–12 cycles/operation, this amounts to up to 40 K cycles/codeword.

In U.S. Pat. No. 6,360,348 issued Mar. 19, 2002 to Yang, a lookup table is constructed to facilitate calculations based on the observation that all the GF operations involved in one iteration of the remainder polynomial are performed on the same set of the second operands, namely, 2t coefficients of the code generator polynomial g(x). Correspondingly, 2t*n values of the results of the multiplications of all n elements of GF by 2t coefficients of the code generator polynomial g(x) are pre-calculated and stored in the lookup table so that the contents of each entry F(f,i) in the table is defined as:

$$F(f,i) = f \otimes g_i, \quad (22)$$

where f stands for the Galois field element in the polynomial form, $g_i$ is a coefficient of the code generator polynomial and sign "$\otimes$" denotes Galois field multiplication operation.

If this approach is used, even when the number of the errors corrected is relatively small, say 8 errors, and the Galois field used is GF(256), the size of the table is 4 Kbytes (16*256*1 byte, 16 is the number of check bytes to correct 8 errors). Often several different options for the RS code should be executed—e.g., when using several latency paths in the ADSL application, the codeword in one latency path has 16 check bytes and in another latency path has 12 check bytes, in this case the memory size will be 7 Kb etc.

According to a feature of the present invention, the GF operation $f \otimes g_i$, where f stands for arbitrary GF element in the polynomial form, $g_i$ is a coefficient of the code generator polynomial and sign "$\otimes$" denotes Galois field multiplication operation, is performed in two steps using two small tables:

1) An arbitrary GF element f is first represented as the sum of its "low" and "high" parts—e.g., in the GF(256) we can write $$f = H0 + 0L \quad (23)$$

where H and L are easily obtained from f with two AND operations using high and low masks $$H = f \ \& \ 0xF0, \ L = f \ \& \ 0x0F \quad (24)$$

2) The GFMUL operation $f \otimes g_i$, using properties of the Galois field, can be performed as $$f \otimes g_i = (H+L) \otimes g_i = H \otimes g_i + L \otimes g_i \quad (25)$$

Figure 2:
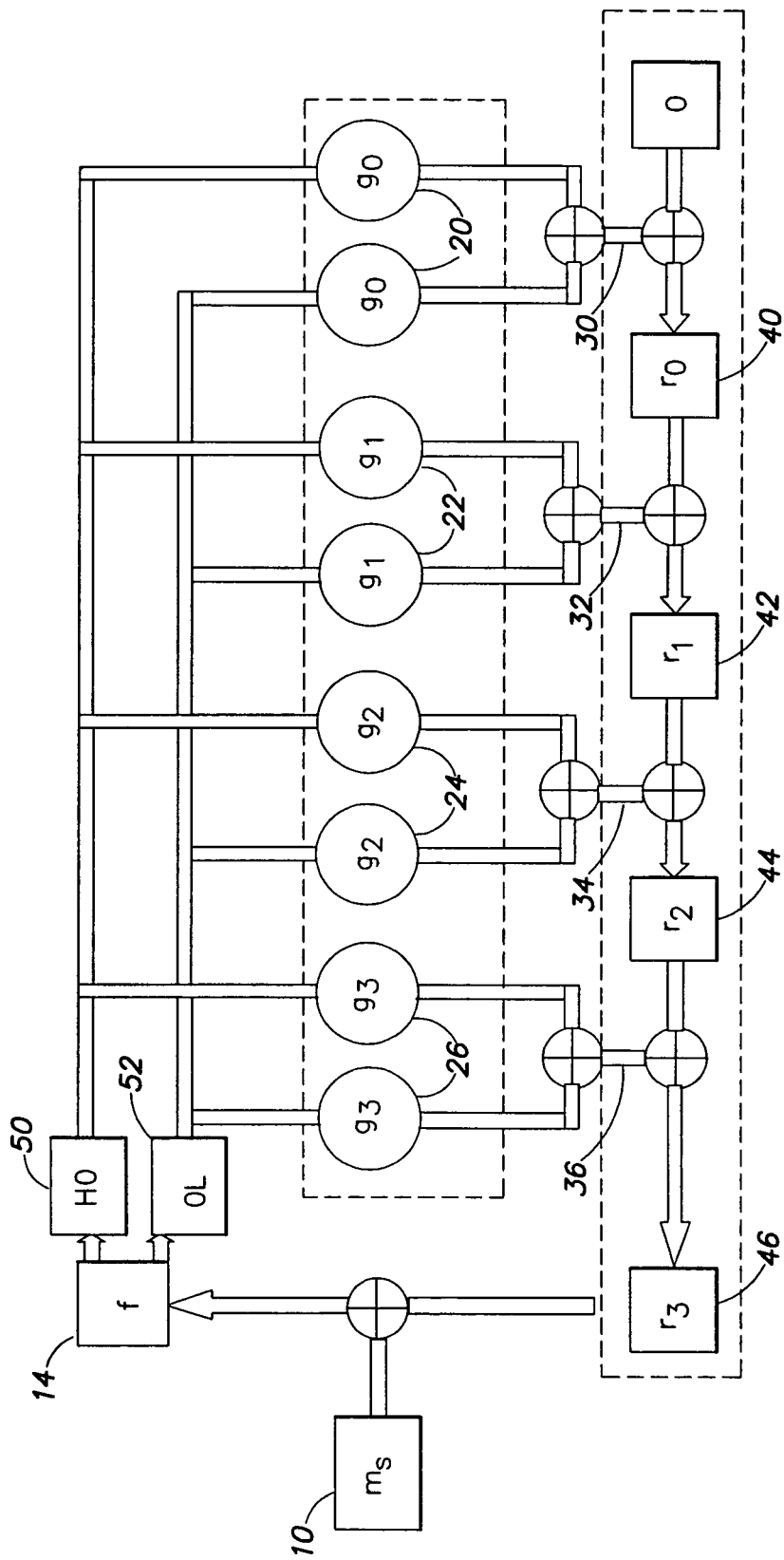
FIG. 2 is a schematic block diagram that illustrates a method for Reed-Solomon encoding, wherein the Galois field element is separated into halfwords before multiplication by the code generator coefficients.

The operations of equations (23)–(25) are illustrated in FIG. 2. As shown, Galois field element 14 is separated into a high halfword 50 (H0) and a low halfword 52 (HL) using high and low masks according to equation (24). The high and low halfwords are each multiplied by each of the code generator coefficients 20, 22, 24, and 26. The respective products are summed to provide intermediate values. The intermediate values are summed with the previous remainder symbols to provide current remainder symbols. The architecture of FIG. 2 is combined with lookup tables to achieve advantageous results.

3) Using equation (25), two small lookup tables are constructed, each holding consecutive results of the GFMUL (Galois field multiplication) of the set of generator polynomial coefficients $g_i$ by all 16 possible cases of the "low" and "high" halfword:

$$TH(H,i)=(H0)\hat{\times} g_i \qquad (26)$$

$$TL(L,i)=(0L)\hat{\times} g_i \qquad (27)$$

4) The size of each table in the case of GF(256) and 16 coefficients of the code generator polynomial is 256 bytes, and the total size of the two tables is 512 bytes—8 times smaller than in the prior art approach, with the total execution time only ~50% longer because ~50% of the operations are not directly connected with the execution of the GFMUL operation.

Operations involved in the iteration of the remainder by one step (one information symbol/byte) can be executed in the following sequence:

$$f=m_{k+1}\hat{ }r_{k,2t-1} \qquad (28)$$

$$f=H0+0L \qquad (29)$$

for $i=1{:}2t-1$ $s=TH(H,i)\hat{ }TL(L,i)$, $r_i=s\hat{ }r_{i-1}, r_0=TH(H,0)$
$\hat{ }TL(L,0)$. $\qquad (30)$ Each iteration requires two accesses to the lookup tables and subsequent XOR operations readily available on any microprocessor.

Figure 3:
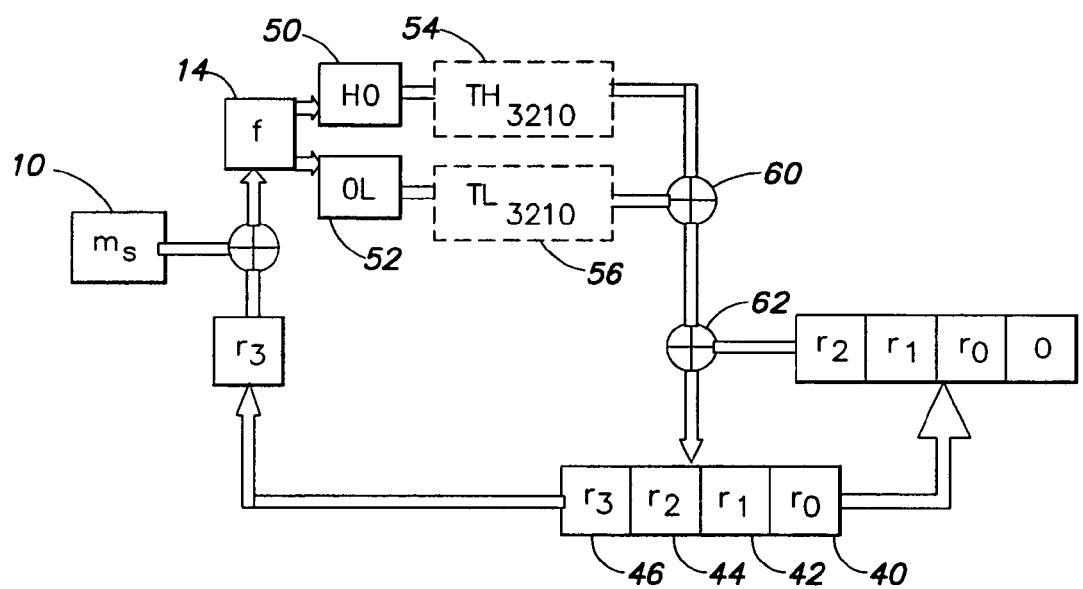
FIG. 3 is a schematic block diagram that illustrates Reed-Solomon encoding in accordance with an embodiment of the invention.

Code generation using lookup tables TH and TL is illustrated schematically in FIG. 3. As indicated above, a first lookup table contains the values of high halfword H0 multiplied by each of the code generator coefficients and a second lookup fable contains the values of low halfword 0L multiplied by each of the code generator coefficients. The high halfword value is used with a coefficient index to access table TH to provide one or more high table values 54, and the low halfword value is used with the coefficient index to access table TL to provide one or more low table values 56. Respective high and low table values with the same coefficient index are summed: in summing operation 60 to provide intermediate values, and the intermediate values are summed with the respective previous remainder symbols in summing operation 62 to provide current remainder symbols 40, 42, 44 and 46. As discussed below, the lookup tables can provide a single set of table values to be summed or two or more sets of table values to be summed, depending on the architecture of the system performing code generation.

The content of the lookup tables in accordance with an embodiment of the invention is shown in FIGS. 4A and 4B. FIG. 4A illustrates a high halfword table 70 and FIG. 4B illustrates a low halfword table 72 (TL). As shown, table 70 contains the products of each possible value of the high halfword H0 multiplied by each of the code generator coefficients. Thus, each entry in table 70 contains a value of $g_iH$, where i ranges from 0 to 2t−1 and H ranges from 0 to the maximum value of high halfword H. Similarly, each entry in table 72 contains a value of $g_iL$, where i ranges from 0 to 2t−1 and L ranges from 0 to the maximum value of low halfword L. For the common case where the message symbols are bytes, the high halfword has 16 possible values ranging from 00 to F0 (using hexadecimal notation). The number of code generator coefficients depends on the number of desired check symbols and may be 16 for the case of eight check symbols. Similarly, table 72 contains the products of each possible value of the low halfword 0L multiplied by each of the code generator coefficients. Where the message symbols are bytes, the low halfword values range from 0 to F. Thus, for the case where the message symbols are bytes and the code generator has 16 coefficients, each of lookup tables 70 and 72 has 256 entries. In the example of FIGS. 4A and 4B, tables 70 and 72 are organized such that each row contains the products corresponding to one halfword value. As discussed below, this organization facilitates parallel execution in a typical processor.

The invention has been described in connection with embodiments where an eight-bit Galois field element is divided into high and low halfwords and two lookup tables are utilized. In other embodiments, each Galois field element may have more than eight bits. Furthermore, each Galois field element may be separated into more than two components and more than two lookup tables may be utilized. Consider a 16-bit Galois field element. The approach described in U.S. Pat. No. 6,360,348 requires a 2 M byte lookup table. In an embodiment where each 16-bit Galois field element is separated into two components, two lookup tables, each of 8 K bytes (16 coefficients×256 half GF element values×2 bytes per entry), are required. In an embodiment where each 16-bit Galois field element is separated into four components, four lookup tables, each of 512 bytes (16 coefficients×16 quarter GF element values×2 bytes per entry), are required.

For any DSP (digital signal processor) with a data access word size more than 8 bits wide, which is the case for all modem DSPs, an additional advantage of this embodiment can be achieved simply because of the fact that table accesses can be conducted with a monotonically increasing second index, so the table can be used as one-dimensional array with sequential access, and shift register cells are used in a strictly sequential order. This fact greatly speeds up the execution, first because multiple entries are read in one cycle, and second because the XOR operation can also be performed on the multiple Galois field symbols simultaneously—e.g., 4 symbols at once when implemented on DSPs with a 32-bit data word path, 8 symbols for DSPs with a 64-bit data word path, etc. For example, one particular implementation on the Blackfin DSP, which has a 32-bit data path with certain restrictions, works with a speed close to 1.5 cycle/check byte/data byte, which is 5–6 times faster than the conventional method and even 2 times faster than a DSP having a built-in Galois field multiplier.

Figure 5:
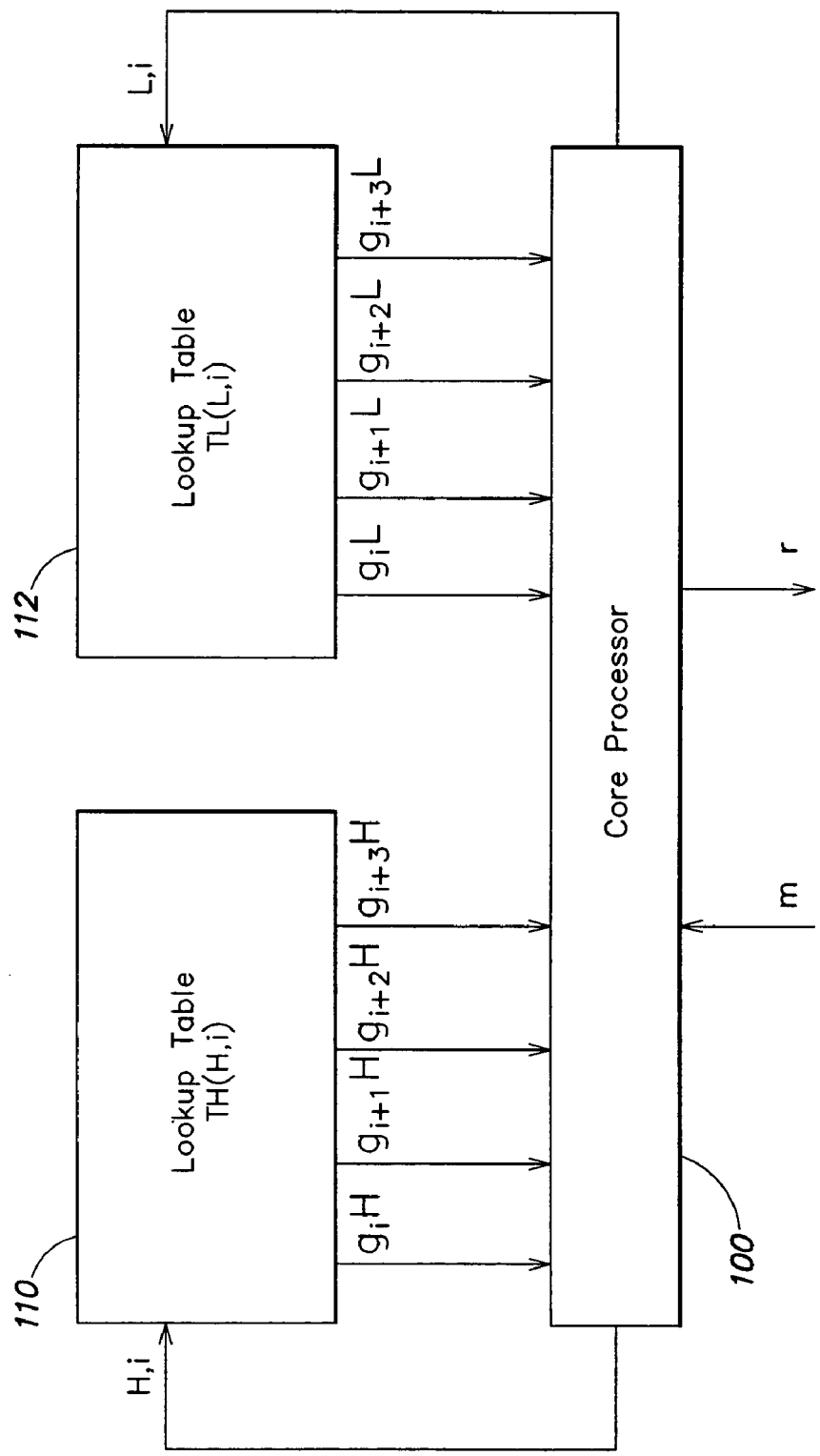
FIG. 5 is a schematic block diagram that illustrates Reed-Solomon encoding in a digital signal processor in accordance with an embodiment of the invention.
Figure 6:
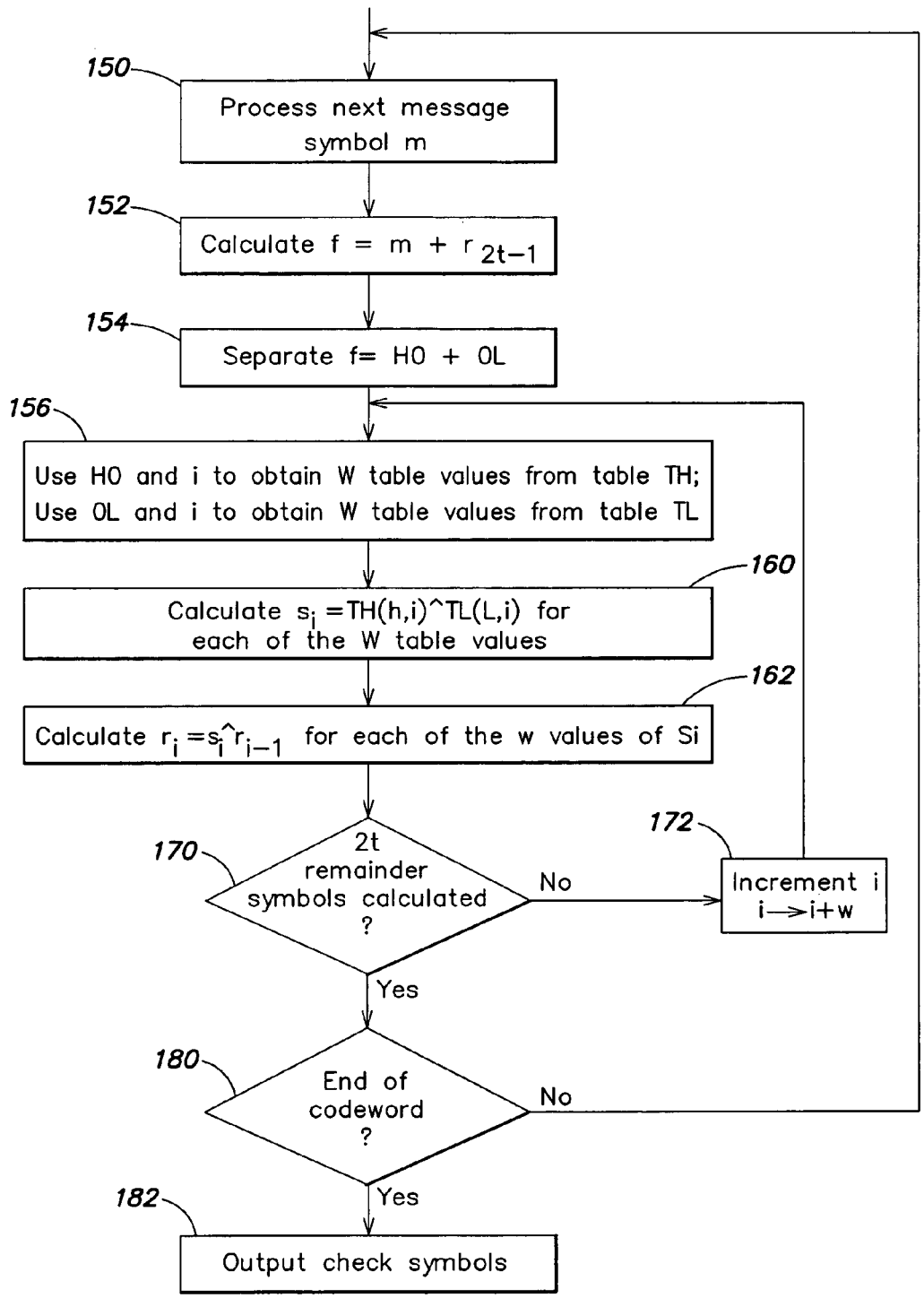
FIG. 6 is a flow chart that illustrates Reed-Solomon encoding in accordance with an embodiment of the invention.

A block diagram of a digital signal processor for encoding data according to an embodiment of the invention is shown in FIG. 5. A process for encoding data in a digital signal processor having a word width of w Galois field elements, according to an embodiment of the invention, is shown in FIG. 6. In the embodiment of FIG. 5, a core processor 100 of the digital signal processor receives message symbols m and supplies check symbols r to be transmitted with the message symbols of a codeword. The core processor 100 accesses a high halfword lookup table 110 and receives table values $g_iH$, $g_{i+1}H$, $g_{i+2}H$ and $g_{i+3}H$. The core processor 100 also accesses a low halfword lookup table 112 and receives table values $g_iL$, $g_{i+1}L$, $g_{i+2}L$ and $g_{i+3}L$. In the embodiment of FIG. 5, message symbols m are bytes and core processor 100 has a word width of 32 bits. Accordingly, core processor 100 may process four table values per cycle from each of lookup table 110 and lookup table 112 as shown in FIG. 5 and described below. Core processors having different word widths may process more or fewer table values per cycle.

Referring again to FIG. 6, a next message symbol m is received and processed in step 150. In step 152, a Galois field element f is calculated from the message symbol and a high order remainder symbol, as shown in Equation (28). In step 154, the Galois field element is separated into first and second components, H0 and 0L, as shown in Equations (23) and (24). In this embodiment, the Galois field element is separated into high and low halfwords. However, in other embodiments, the Galois field element may be separated into more than two components.

In step 156, the high halfword H0 and an index i are used to access w table values from lookup table 110 (FIG. 5). The index i is an index of generator coefficient $g_i$. In the example where the codeword has 16 check symbols and the code generator polynomial has 16 coefficients, index i ranges from 0 to 15. Also in step 156, low halfword 0L and index i are used to obtain w table values from lookup table 112 (FIG. 5). As indicated above, the number of table values accessed simultaneously depends on the word width of core processor 100 expressed in units of Galois field elements. For a typical case where core processor 100 has a 32-bit word width and the message symbols are bytes, w=4 table values are accessed simultaneously in each of lookup tables 110 and 112.

In steps 160 and 162, a remainder symbol $r_i$ is calculated for each of the w sets of table values accessed in step 156. More specifically, an intermediate value $s_i$ is calculated in step 160 for each of the w sets of table values as shown in Equation (30). A set of table values includes a table value from lookup table 110 and a table value from lookup table 112, the two table values having the same generator coefficient index. Then, a current remainder symbol $r_i$ is calculated by an exclusive OR operation on the intermediate value $s_i$ and a previous remainder symbol $r_{i-1}$ for each of the w intermediate values $s_i$ as also shown in Equation (30). Thus, w remainder symbols are calculated in step 162.

In step 170, a determination is made as to whether 2t remainder symbols have been calculated, where 2t represents the number of coefficients in the code generator polynomial. If 2t remainder symbols have not been calculated, the index i is incremented by w in step 172. The process then returns to step 156 to access w new table values in table 110 and w new table values in table 112. The loop including steps 156, 160, 162, 170, and 172 is repeated until 2t reminder symbols have been calculated. For the example where w=4 and 2t=16, four iterations of the loop are required.

When 2t remainder symbols have been calculated, a determination is made in step 180 as to whether the end of the codeword has been reached. A typical codeword may include 188 message symbols. When the end of the codeword has not been reached, the process returns to step 150 to process the next message symbol m. When the end of the codeword has been reached, 2t check symbols are output in step 182. Thus, for example, 16 check symbols may be output for transmission with the 188 message symbols of the codeword.

In some applications, such as an ADSL modem, the parameters of the RS code can be set "on the fly" and can be different for different bearer channels within one ADSL channel. In this case, two methods of encoding can be realized based on the present invention.

According to the first method, only the table for the highest possible number of check bytes is generated, and if a code with less error correction capability is used, the encoder works in two stages as follows.

First, it is observed that a code generator polynomial $G_{2t}$ of a higher degree contains as a factor a code generator polynomial $G_{2s}$ of a lower degree, $$G_{2s}(x)=(x-a^{2s-1}) \ldots (x-a^0) \tag{31}$$

$$G_{2t}(x)=(x-a^{2t-1}) \ldots (x-a^0)=(x-a^{2t-1}) \ldots (x-a^{2s-1}) \ldots (x-a^0)=h_{2d}(x)G_{2s}(x) \tag{32}$$

where $$h_{2d}(x)=(x-a^{2t-1}) \ldots (x-a^{2s}) \tag{33}$$

and d=t−s is the difference between the error-correcting capabilities of the code.

Correspondingly, a message polynomial of degree n is partitioned into two parts—higher n−2d terms and lower 2d terms $$M_n(x)=M_{n-2d}(x)x^{2d}+M_{2d}(x) \tag{34}$$

and a shifted message polynomial, into which the code generator polynomial should be divided, is represented as $$M_n(x)x^{2s}=M_{n-2d}(x)x^{2d}x_{2s}+M_{2d}(x)x^{2s}=M_{n-2d}(x)x^{2s+2d}+M_{2d}(x)x^{2s}=M_{n-2d}(x)x^{2t}+M_{2d}(x)x^{2s}. \tag{35}$$

Now the remainder for the first n−2d bytes of the message in relation to the code generator polynomial of the higher degree 2t is obtained as $$M_{n-2d}(x)x^{2t}=Q(x)G_{2t}(x)+R(x) \tag{36}$$

where the first term can be written as $$Q(x)G_{2t}(x)=Q(x)h_{2d}(x)G_{2s}(x)=Q_1(x)G_{2s}(x) \tag{37}$$

with $$Q_1(x)=Q(x)h_{2d}(x). \tag{38}$$

Following the same logic, the "long" remainder R(x) consisting of 2t is broken into two parts—higher 2d terms and lower 2s terms $$R(x)=r_{2d}(x)x^{2s}+R_{2s-1}(x) \tag{39}$$

and finally the encoding can be performed according to the formula $$M_n(x)x^{2s}=M_{n-2d}(x)x^{2t}+M_{2d}(x)x^{2s}=Q_1(x)G_{2s}(x)+M_{2d}(x)x^{2s}+R_{2s-1}(x) \tag{40}$$

This is equivalent to the encoding relatively short message (only 2d bytes)

$$(M_{2d}(x)+r_{2d}(x))x^{2s}=Q_2(x)G_{2s}(x)+R_2(x) \tag{41}$$

and adding the result of this operation with the "shortened" result of the "long" encoding $$M_n(x)x^{2s}=Q_1(x)G_{2s}(x)+Q_2(x)G_{2s}(x)+R_2(x)+R_{2s-1}(x)=(Q_1(x)+Q_2(x))G_{2s}(x)+(R_2(x)+R_{2s-1}(x)) \tag{42}$$

As a result, the total chain of encoding can be described as follows: the last 2d bytes of the message $M_{2d}(x)$ are added (XOR'ed) with the first (left-most) 2d bytes of the obtained remainder $r_{2d}(x)$ and these 2d bytes are treated as a short message and are encoded using the conventional method; the result is added to the remaining bytes of the "long" remainder R(x)—this is the final result of the encoding.

This method has overhead D(td) attributed to the additional "reencoding" of 2d bytes, which is proportional to the number of bytes encoded and number of bytes in the result $$D(t,d)=K*2d*2(t-d), \tag{43}$$

where K is the number of cycles—usually 10–12—required for conventional encoding. This overhead has a maximum value for d=t/2 K*$t^2$, and can be at the level of 768 cycles with K=12, t=8, which constitutes ~20% of the main part of the encoding.

Another option is to generate "right" tables on the fly for any required code parameters which can require additional memory. To take full advantage of a DSP with a wide data path, however, in this case, according to an aspect of the invention, when the number of check bytes is not an integer multiple of 4, the table is generated with a size 32*4k, where 4k is the closest integer multiple of 4 from above to the specified number of check bytes—e.g., 16 for 14, 12 for 10, etc. The remaining 64 bytes are filled by zeros, so when these values are read, they don't affect the result of the calculation.

The same tables used in the encoder may be used in the decoder for calculating the syndromes in the following manner. The received codeword in a systematic form is first "re-encoded"—the encoder mechanism is run on the information bytes of the codeword to obtain a "copy" of the sequence of the check bytes actually received. Then this reconstructed "copy" is bitwise compared using a logical AND operator with the actually received check bytes forming the polynomial closely related with the syndromes—namely, the values of this polynomial on the consecutive powers of the primitive element of the GF are exactly the components of the syndrome because of the relation $$M(x)=Q(x)G(x)+R(x),\ S_k=M(a^k)=Q(a^k)G(a^k)+R(a^k),$$
$$k=0,1,\ldots 2t-1 \quad (44)$$

because $G(a^k)=0$ by definition of the code generator polynomial $$G(x)=(x-a^{2t-1})\ldots(x-a^0) \quad (45)$$

So the accumulation of the syndrome can be performed using the conventional approach on a much shorter sequence of 2t bytes than the original codeword of length n bytes. This involves $(2t-1)^2$ non-trivial GF multiplications which is of the same order of operations needed to implement Berlekamp-Massey or Euclid algorithm to find the coefficients of the error locator polynomial. Because GF multiplications are performed on a fixed set of one of the operands, the speed of this calculations is actually 30–50% higher than the general GF multiplication so in the case of a (255,239,16) RS code, at most 225*6=1350 cycles are required, which is 30% overhead.

Having thus described the inventive concepts and a number of exemplary embodiments, it will be apparent to those skilled in the art that the invention may be implemented in various ways, and that modifications and improvements will readily occur to such persons. Thus, the examples given are not intended to be limiting, and are provided by way of example only. The invention is limited only as required by the following claims and equivalents thereto.

What is claimed is:

1. A method for encoding data, comprising:
   (a) providing a first table of first component values multiplied by code generator coefficients and a second table of second component values multiplied by the code generator coefficients;
   (b) determining a Galois field element based on a message symbol and a high order remainder symbol;
   (c) separating the Galois field element into first and second components;
   (d) using the first component and a generator coefficient index to access one or more first table values in the first table and using the second component and the generator coefficient index to access one or more second table values in the second table;
   (e) determining a current remainder symbol based on first and second table values having equal generator coefficient indices, and a previous remainder symbol;
   (f) performing step (e) for each generator coefficient of the code generator to provide a group of remainder symbols; and
   (g) performing steps (b)–(f) for each message symbol in a codeword to provide a group of final remainder symbols which constitute check symbols to be transmitted with the message symbols of the codeword.

2. A method as defined in claim 1, wherein step (b) comprises an exclusive OR operation on the message symbol and the high order remainder symbol.

3. A method as defined in claim 2, wherein step (e) comprises an exclusive OR operation on the first and second table values to provide an intermediate value, and an exclusive OR operation on the intermediate value and the previous remainder symbol to provide the current remainder symbol.

4. A method as defined in claim 1, wherein the first and second components comprise high and low halfwords, respectively, of the Galois field element.

5. A method as defined in claim 1, wherein the message symbols of the codeword comprise message bytes.

6. A method as defined in claim 5, wherein step (g) produces 16 check symbols for correcting up to eight errors in the codeword.

7. A method as defined in claim 1, wherein step (d) comprises accessing two or more sets of first and second table values in parallel and wherein step (e) comprises determining two or more current remainder symbols in parallel.

8. A method as defined in claim 1, wherein separating the Galois field element into first and second components comprises ANDing the Galois field element with first and second masks.

9. A method as defined in claim 1, wherein step (d) comprises accessing w sets of first and second table values in parallel, wherein w represents a word width of a processor performing encoding in units of the Galois field element, and wherein step (e) comprises determining w current remainder symbols in parallel.

10. A method as defined in claim 1, wherein step (a) comprises generating, during operation, the table values in the first and second tables for prescribed code parameters.

11. A method as defined in claim 1, wherein step (g) comprises providing a number of check symbols equal to the number of generator coefficients.

12. A method as defined in claim 1, wherein step (g) comprises providing a number of check symbols less than the number of generator coefficients.

13. Apparatus for encoding data, comprising:
   a first lookup table containing first component values multiplied by code generator coefficients;
   a second lookup table containing second component values multiplied by the code generator coefficients; and
   a processor comprising means for determining a Galois field element based on a message symbol and a high order remainder symbol, means for separating the Galois field element into first and second components, means, using the first component and a generator coefficient index, for accessing one or more first table values in the first lookup table, means, using the second component and the generator coefficient index, for accessing one or more second table values in the second table; and means for determining a current remainder symbol, based on first and second table values having equal generator coefficient indices, and a previous remainder symbol, for each generator coefficient of the code generator to provide a group of remainder symbols, wherein each message symbol of a codeword is processed to provide a group of final remainder symbols which constitute check symbols to be transmitted with the message symbols of the codeword.

14. Apparatus as defined in claim 13, wherein the means for determining a Galois field element comprises means for performing an exclusive OR operation on the message symbol and the high order remainder symbol.

15. Apparatus as defined in claim 13, wherein the means for determining a current remainder symbol comprises means for performing an exclusive OR operation on the first and second table values to provide an intermediate value and means for performing an exclusive OR operation on the intermediate value and the previous remainder symbol to provide the current remainder symbol.

16. Apparatus as defined in claim 13, wherein the first and second components comprise high and low halfwords, respectively, of the Galois field element.

17. Apparatus as defined in claim 13, wherein the message symbols of the codeword comprise message bytes.

18. Apparatus as defined in claim 13, wherein the processor is configured to produce 16 check symbols for correcting up to eight errors in the codeword.

19. Apparatus as defined in claim 13, wherein the means for accessing first and second table values comprises means for accessing two or more sets of first and second table values in parallel, and wherein the means for determining a current remainder symbol comprises means for determining two or more current remainder symbols in parallel.

20. Apparatus as defined in claim 13, wherein the means for separating the Galois field element into first and second components comprises means for ANDing the Galois field element with first and second masks.

21. Apparatus as defined in claim 13, wherein the means for accessing first and second table values comprises means for accessing w sets of first and second table values in parallel, wherein w represents a word width of the processor in units of the Galois field element, and wherein the means for determining a current remainder symbol comprises means for determining w current remainder symbols in parallel.

22. Apparatus as defined in claim 13, wherein the processor further comprises means for generating, during operation, the table values in the first and second lookup tables for prescribed code parameters.

23. Apparatus as defined in claim 13, wherein each message symbol of the codeword is processed to provide a number of check symbols equal to the number of generator coefficients.

24. Apparatus as defined in claim 13, wherein each message symbol of the codeword is processed to provide a number of check symbols less than the number of generator coefficients.

* * * * *